United States Patent
Lochtefeld et al.

(10) Patent No.: US 10,971,647 B2
(45) Date of Patent: Apr. 6, 2021

(54) SOLAR CELL VIA THIN FILM SOLDER BOND

(71) Applicant: AmberWave, Inc., Salem, NH (US)

(72) Inventors: Anthony Lochtefeld, Ipswich, MA (US); Allen Barnett, Avondale, PA (US)

(73) Assignee: AmberWave, Inc., Salem, NH (US)

( * ) Notice: Subject to any disclaimer, the term of this patent is extended or adjusted under 35 U.S.C. 154(b) by 0 days.

(21) Appl. No.: 16/405,545

(22) Filed: May 7, 2019

(65) Prior Publication Data

US 2019/0341512 A1 Nov. 7, 2019

Related U.S. Application Data

(60) Provisional application No. 62/667,774, filed on May 7, 2018.

(51) Int. Cl.
| | |
|---|---|
| *H01L 31/18* | (2006.01) |
| *H01L 31/068* | (2012.01) |
| *H01L 31/047* | (2014.01) |
| *H01L 31/05* | (2014.01) |
| *H01L 31/048* | (2014.01) |
| *H01L 23/00* | (2006.01) |

(52) U.S. Cl.
CPC ...... *H01L 31/1892* (2013.01); *H01L 31/0682* (2013.01); *H01L 31/1804* (2013.01); *H01L 31/1868* (2013.01); *H01L 24/26* (2013.01); *H01L 31/047* (2014.12); *H01L 31/048* (2013.01); *H01L 31/05* (2013.01)

(58) Field of Classification Search
CPC ....... H01L 31/0682–0684; H01L 31/18–1824; H01L 31/1892–1896; Y02E 10/50
See application file for complete search history.

(56) References Cited

U.S. PATENT DOCUMENTS

| | | | | |
|---|---|---|---|---|
| 4,886,555 | A * | 12/1989 | Hackstein | H01L 31/02167 136/255 |
| 6,091,021 | A * | 7/2000 | Ruby | H01L 31/02167 136/255 |
| 9,590,130 | B2 * | 3/2017 | Lochtefeld | H01L 31/184 |
| 2009/0194153 | A1 * | 8/2009 | Hilali | H01L 31/1836 136/255 |
| 2010/0071764 | A1 * | 3/2010 | Kim | H01L 31/03529 136/256 |
| 2010/0275982 | A1 * | 11/2010 | Abbott | H01L 31/0352 136/255 |
| 2012/0273043 | A1 * | 11/2012 | Lochtefeld | H01L 31/06875 136/261 |

* cited by examiner

*Primary Examiner* — William E McClain
(74) *Attorney, Agent, or Firm* — Harry Andrew Hild, Jr., Esq.

(57) ABSTRACT

A method of forming a solar cell device that includes forming a porous layer in a monocrystalline donor substrate and forming an epitaxial semiconductor layer on the porous layer. A solar cell structure is formed on the epitaxial semiconductor layer. A carrier substrate is bonded to the solar cell structure through a bonding layer. The monocrystalline donor substrate is removed by cleaving the porous layer. A grid of metal contacts is formed on the epitaxial semiconductor layer. The exposed portions of the epitaxial semiconductor layer are removed. The exposed surface of the solar cell structure is textured. The textured surface may be passivated, in which the passivated surface can provide an anti-reflective coating.

13 Claims, 11 Drawing Sheets

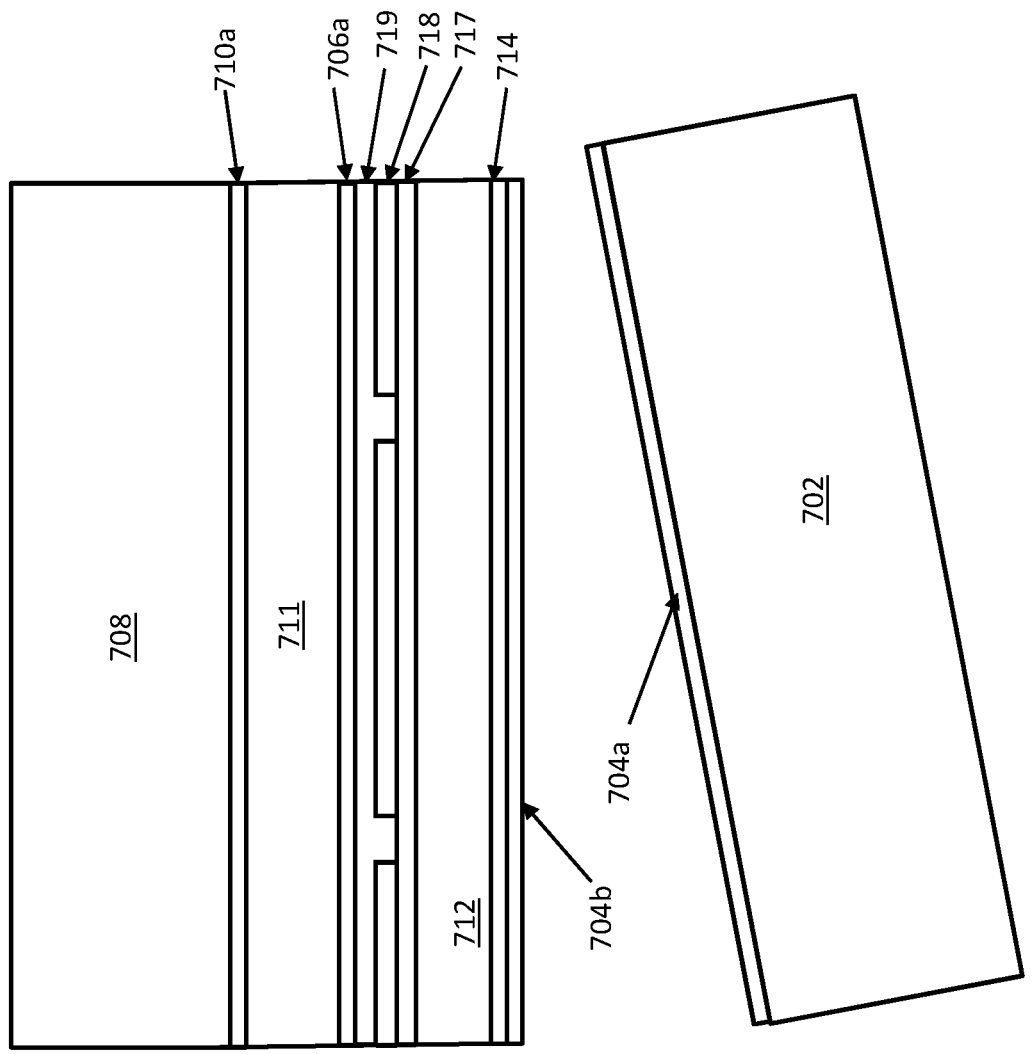

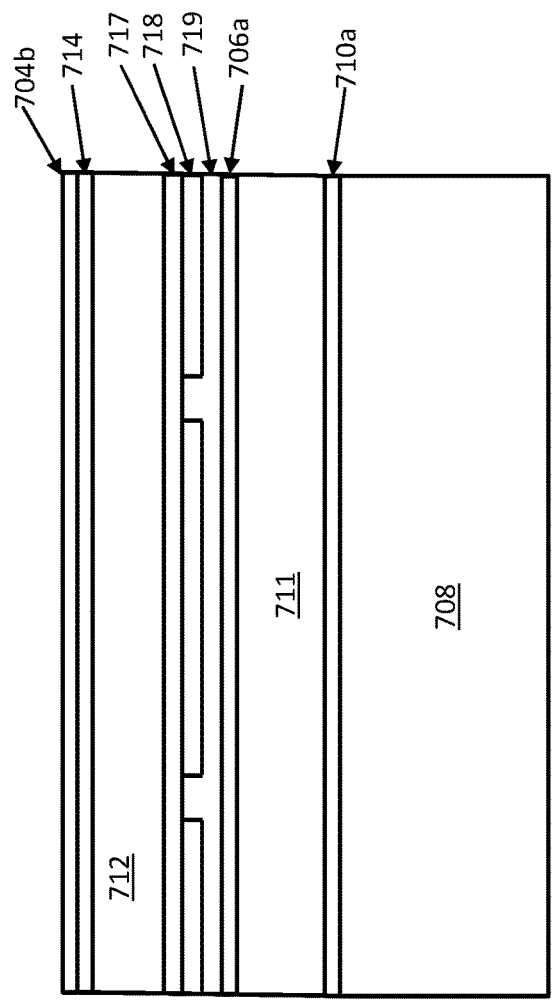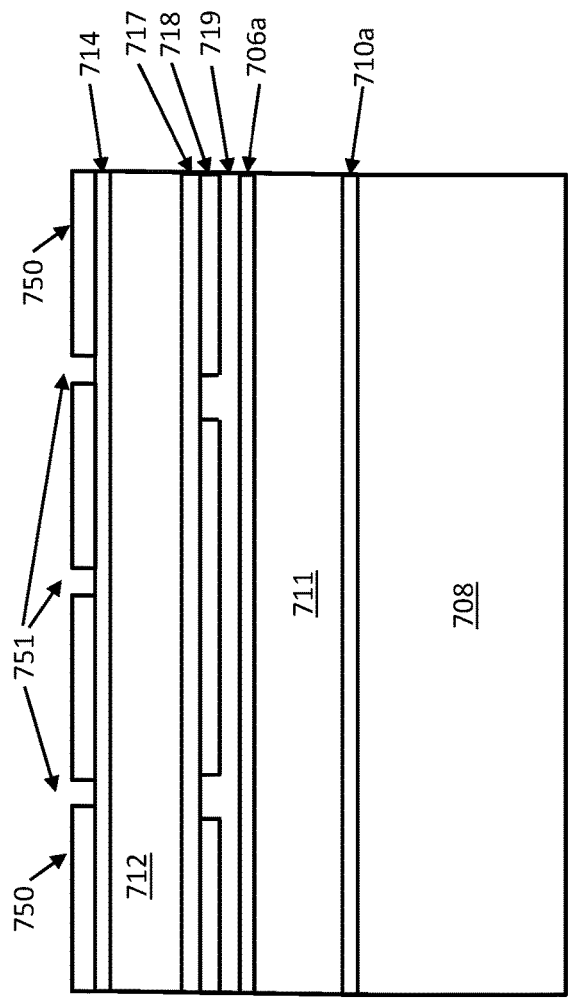

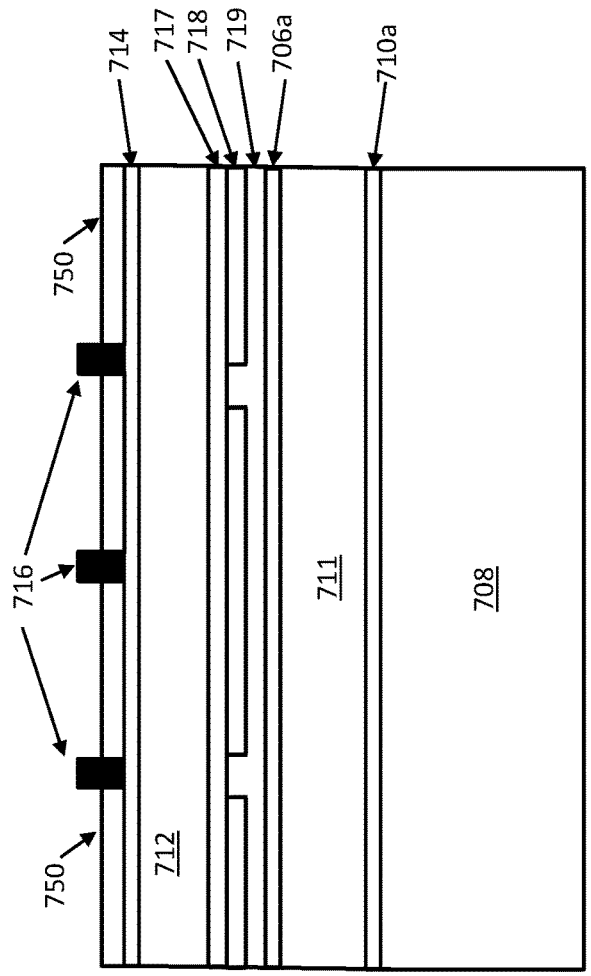
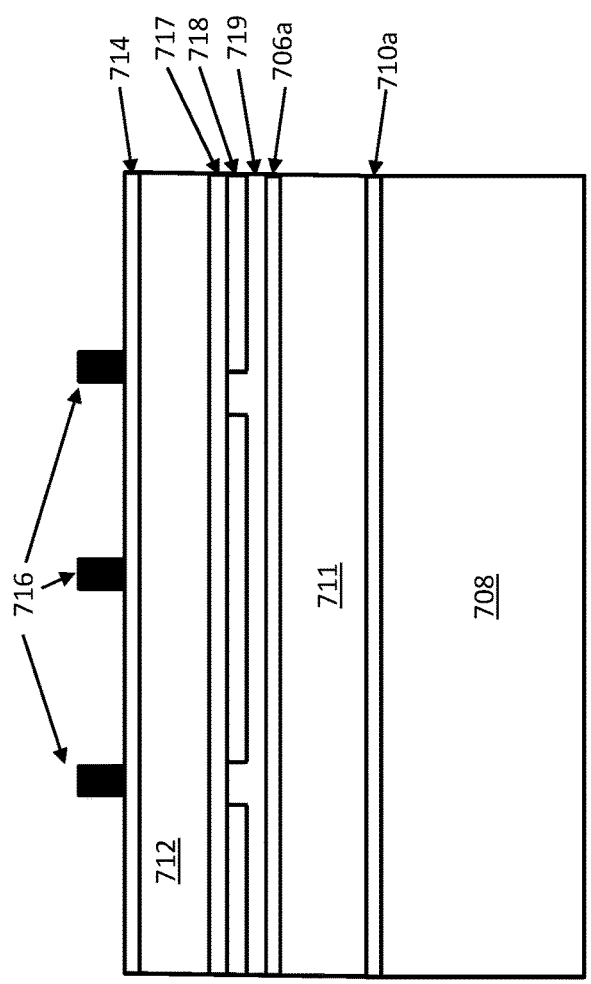
FIG. 1(k)
FIG. 1(m)

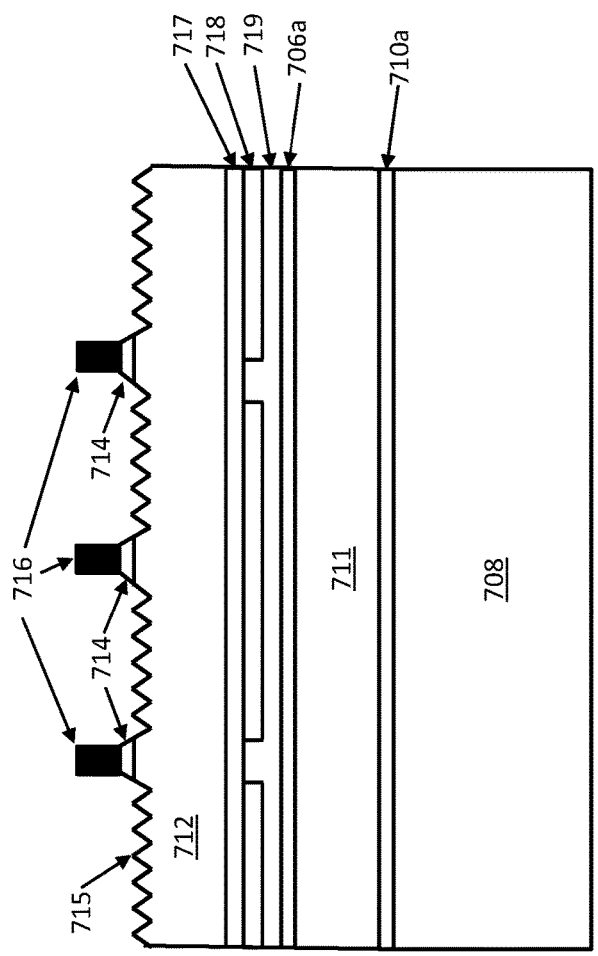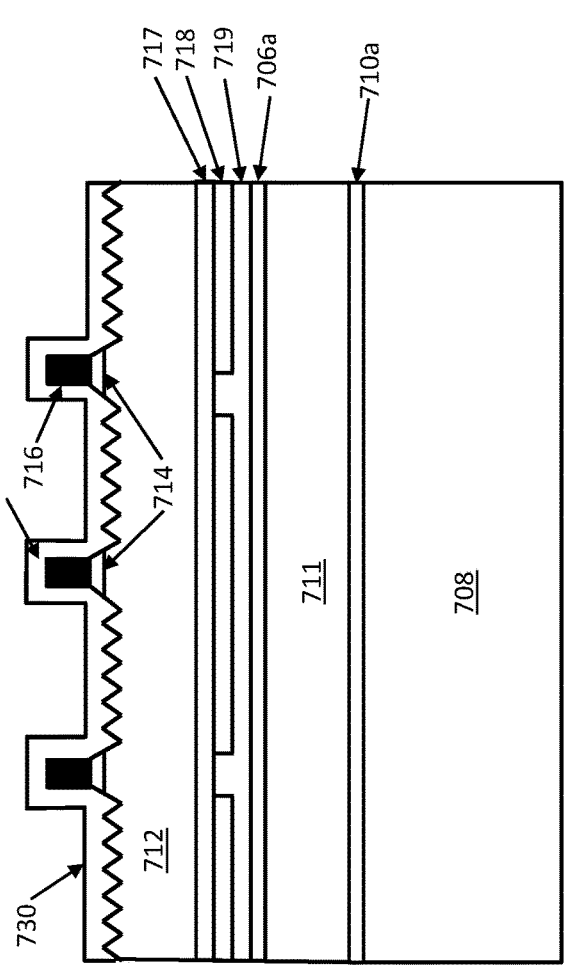

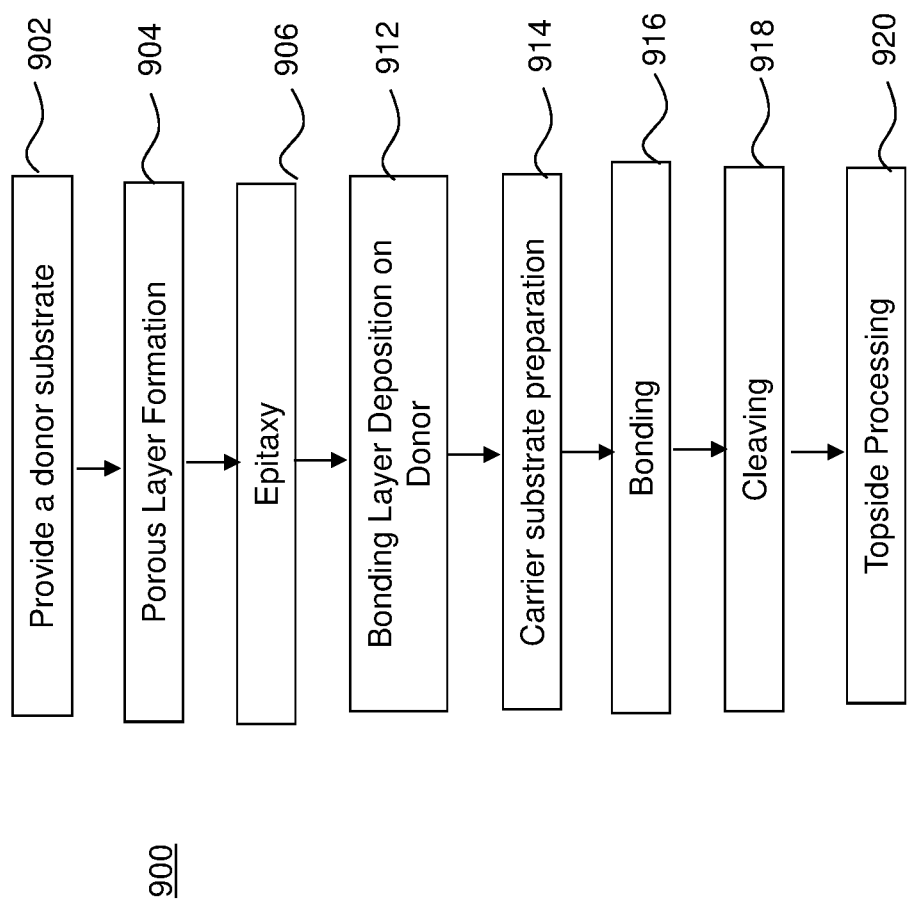

SOLAR CELL VIA THIN FILM SOLDER BOND

CROSS REFERENCE TO RELATED APPLICATION

The present invention claims the benefit of U.S. provisional patent application 62/667,774, filed May 7, 2018, the whole contents and disclosure of which is incorporated by reference as is fully set forth herein.

TECHNICAL FIELD

The present disclosure relates to layer transfer and more particularly, relates to layer transfer of thin film material onto a substrate via solder bonding.

BACKGROUND INFORMATION

Wafer bonding and splitting are methods for facilitating the transfer of thin film semiconductor materials used in making semiconductor substrates for solar cells, LEDs, LDs, optoelectronic integration circuits (OEIC) and microelectromechanical systems (MEMS).

SUMMARY

The present invention is a novel device, system, and method for a solar cell. An exemplary embodiment involves a monocrystalline solar cell device having a monocrystalline silicon donor layer solder bonded to a carrier substrate. The solder bonding layer may be a transient liquid phase bond. The transient liquid phase bond may produce an intermetallic region with a melting temperature higher than the individual components of the transient liquid phase bond.

In one aspect, the present disclosure provides a method of forming a solar cell device that includes forming a porous layer in a monocrystalline donor substrate; and forming an epitaxial semiconductor layer on the porous layer. The method may further include forming a junction for a solar cell structure on the epitaxial semiconductor layer. A carrier substrate can be bonded to the solar cell structure through a bonding layer. In a following step, the monocrystalline donor substrate is removed by cleaving the porous layer. A grid of metal contacts is formed on the epitaxial semiconductor layer. Exposed portions of the epitaxial semiconductor layer are removed, wherein remaining portions of the epitaxial semiconductor layer are present between the grid of metal contacts and the solar cell structure. The exposed surface of the solar cell structure can be textured.

In one embodiment, forming the junction for the solar cell structure includes forming a base region layer on the epitaxial semiconductor layer; and forming an emitter region layer on the base region layer. In some examples, texturing the exposed surface of the solar cell structure includes texturing an exposed surface of the base region layer. In some embodiments, the method further includes forming a passivation layer on at least the textured surface of the base region layer. The passivation layer can provide an anti-reflective coating.

In some embodiments, the solder bonding layer produces a transient liquid phase bond. In one example, the solder bonding layer produces a transient liquid phase bond with an intermetallic region comprising nickel (Ni) and tin (Sn). In another example, the solder bonding layer produces a transient liquid phase bond with an intermetallic region comprising titanium (Ti) and tin (Sn). In yet another example, the solder bonding layer produces a transient liquid phase bond with an intermetallic region comprising copper (Cu) and indium (In).

In some embodiments, the step of forming the porous layer comprises producing a first low porosity layer to serve as a template for constructing the epitaxial semiconductor layer, and a high porosity layer at which cleaving the porous layer occurs.

In another embodiment, a method of forming a solar cell device is provided that includes forming a porous layer in a monocrystalline donor substrate; and forming an epitaxial semiconductor layer on the porous layer. The method may further include forming a junction for a solar cell structure on the epitaxial semiconductor layer. A carrier substrate may be bonded to the solar cell structure through a bonding layer. The method can continue with removing the monocrystalline donor substrate by cleaving the porous layer. A grid of metal contacts can be formed on the epitaxial semiconductor layer. Exposed portions of the epitaxial semiconductor layer can then be removed, wherein remaining portions of the epitaxial semiconductor layer between the grid of metal contacts and the solar cell structure. The method may further include forming a passivation layer on at least portions of the solar cell structure that are exposed by removing the exposed portions of the epitaxial semiconductor layer, wherein the passivation layer provides an anti-reflective coating.

In some embodiments, the solder bonding layer produces a transient liquid phase bond. In some examples, the solder bonding layer produces a transient liquid phase bond with an intermetallic region having a composition selected from the group consisting of $Ni_3Sn_4$, $Ti_6Sn_5$, $Cu_2In$ and combinations thereof.

In one embodiment, the passivation layer has a composition selected from the group consisting of silicon nitride, silicon oxide, amorphous silicon (a-Si), aluminum oxide and combinations thereof.

In another aspect, the present disclosure provides a solar cell device. In one embodiment, the solar cell device includes a carrier substrate and a junction for a solar cell structure including at least one monocrystalline semiconductor layer that is bonded to the carrier substrate by a solder bonding layer. The junction for the solar cell includes a base region layer having portions with a textured surface. A grid of metal contacts is positioned between the portions of the base region layer having the textured surface. A passivation layer is present on at least the textured surface of the base region layer. The passivation layer can provide an anti-reflective coating.

In some embodiments, the solar cell device further includes a base contact region layer that is only present between each metal contact in the grid of meal contacts and the base region layer. The bonding layer for the solar cell device may include an intermetallic region having a composition selected from the group consisting of $Ni_3Sn_4$, $Ti_6Sn_5$, $Cu_2In$ and combinations thereof.

The present invention is not intended to be limited to a system or method that must satisfy one or more of any stated objects or features of the invention. It is also important to note that the present invention is not limited to the exemplary or primary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings wherein:

FIGS. 1(a)-1(k), 1(m), 1(n) and 1(p) are profile diagrams of a device with silicon layer transfer constructed in accordance with an exemplary solder bonding embodiment of the invention.

FIG. 3 is a flow chart of exemplary actions used to construct a device in accordance with the exemplary solder bonding embodiment of the invention.

DETAILED DESCRIPTION OF THE PREFERRED EMBODIMENTS

Figure 1A:
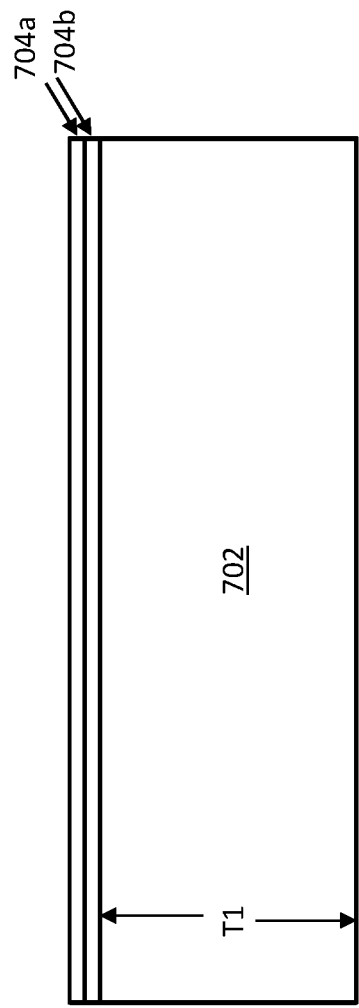

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

In some embodiments, the methods and structures described herein are related to layer transfer and more particularly, relates to layer transfer of thin film material, such as thin film semiconductor materials used in ultra-thin monocrystalline solar cells, onto a substrate via solder bonding. Ultra-thin monocrystalline solar cells have a thickness of 100 microns or less. Ultra-thin monocrystalline solar cells can have several advantages over solar cells composed of multi-crystalline semiconductors or monocrystalline solar cells having a thickness greater than 100 microns.

First, silicon material usage is substantially less than for standard monocrystalline silicon solar cells, especially for the case of thin silicon fabrication techniques that avoid the kerf loss (sawing loss) of approximately 150 microns per silicon wafer produced. This alone could reduce monocrystalline silicon solar cell costs significantly. Second, thin monocrystalline silicon solar cells offer the benefit of lower recombination volume, leading to higher open circuit voltages (Voc) and consequently higher cell efficiencies, leading to lower cost per watt. Third, at thickness below approximately 40 microns, silicon solar cells are highly flexible. It has been determined that the aforementioned advantages by employing thin films to provide ultrathin monocrystalline solar cell can enable a new class of ultra-light, flexible, durable and high efficiency silicon photovoltaic (PV) module products for diverse markets, such as lightweight metal buildings, civilian and U.S. military portable power, satellites, and photovoltaic (PV) devices for developing countries with limited transportation infrastructure.

Despite the aforementioned benefits, it has been determined that free-standing silicon wafers below 100 microns can be too fragile to be processed with low-cost automated cell processing techniques. Additionally, it has been determined that in some instances of photovoltaic designs employing thin semiconductor films that the solar cell efficiencies are disadvantageously low, and can require non-standard and complicated cell processing techniques.

The following embodiments describe solar cell designs and fabrication processes which may be combined with the thin film solder bonding method. In some embodiments, the solder bonding method for forming photovoltaic devices including ultrathin monocrystalline solar cells can provide at least some of the aforementioned advantages, and can also avoid at least some of the aforementioned disadvantages. The methods and structures of the present disclosure are now described with more detail with reference to FIGS. 1(a)-3.

Referring to FIGS. 1(a-p), an exemplary solar cell device is constructed in accordance with an exemplary solder bond embodiment of the invention. It should be noted that although the various embodiments disclosed herein relate to a solar device, embodiments of the disclosure are not limited to solar devices and may be used in the construction of various microelectronic and optoelectronic devices. A monocrystalline donor substrate 702 may be used to construct a first portion of a solar cell and the porous region used later for separation. The monocrystalline donor substrate is composed of a type IV semiconductor. The term "type IV semiconductor material" denotes a semiconductor material that includes at least one element from Group IVA of the Periodic Table of Elements under the Old International Union of Pure and Applied Chemistry (IUPAC) classification system, or Group 14 of the New International Union of Pure and Applied Chemistry classification system. In some embodiments, the monocrystalline donor substrate 702 is a silicon (Si) substrate. It is noted that although the following example describes the use of a monocrystalline donor substrate 702 of monocrystalline silicon, embodiments have also been contemplated, in which other type IV semiconductor compositions may be employed, as well as type III-V semiconductor material compositions.

The donor substrate 702 may be, for example, but not limited to, a (100) or (111) surface orientation. In one example, the donor substrate 702 may have a thickness t1 of about 150 microns to 2000 microns. In another example, the donor substrate 702 may have a thickness ranging from 250 microns to 1000 microns. The diameter of the donor substrate 702 may be, but is not limited to, standard wafer sizes ranging from about 100 mm to 300 mm. In other embodiments, a square or semi-square substrate may be used, of approximately 5" or 6" on a side, such as is commonly used in crystalline Si solar cells. The donor substrate 702 may be doped p-type or n+ or alternately may be more lightly doped n-type if it is illuminated during porous silicon formation. As used herein, "p-type" refers to the addition of impurities to an intrinsic semiconductor that creates deficiencies of valence electrons. In a silicon donor substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing donor substrate 702, examples of n-type dopants, i.e., impurities, include but are not limited to antimony, arsenic and phosphorous. According to some embodiments, the donor substrate 702 may be p-type and have resistivity below about 1 ohm-cm.

Referring to FIG. 1(a), in some embodiments, at least one porous layer, e.g., dual porous layers 704a, 704b, may be formed on the surface of the donor substrate 702. The top porous layer 704a may have a lower porosity, to serve as a template for subsequent epitaxial growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The bottom porous layer 704b may have a higher porosity, to allow subsequent splitting during layer transfer steps.

In one embodiment, the dual porous layers 704a, 704b are formed on the donor substrate 702 by a process that can include the step of immersing a p-type (100)-oriented monocrystalline Si substrate (also referred to as the donor substrate 702), which can have a resistivity ranging from 0.01 ohm-cm to 0.02 ohm-cm, in a solution composed of one part hydrofluoric (HF) acid, one part water ($H_2O$), and one part isopropyl alcohol ($C_3H_8O$). The donor substrate 702 is arranged in the solution in series and in-line with two electrodes. The two electrodes may be formed of silicon or diamond. The two electrodes are arranged so that one of the two electrodes is facing the front of the donor substrate 702 and the other of the two electrodes is facing the rear of the donor substrate 702. The substrate holder that supports the donor substrate 702 within the solution is electrically insulating, forcing electrical current to pass primarily through the donor substrate 702 and not around the wafer periphery. The electrodes may be separated from the donor substrate 702 by a distance of at least 10% of the diameter of the donor substrate 702. Through application of a voltage to such an apparatus, an electrical current flows in the solution and through the donor substrate 702, resulting in a porous silicon layer, e.g., dual porous layers 704a, 704b, being etched into a surface of the donor substrate 702.

Still referring to FIG. 1(a), in some embodiments, two different voltages, one after another, may be applied between the electrodes while the donor substrate 702 is present in the suspension, resulting in the formation of two different porous silicon layers 704a, 704b on a surface of the donor substrate 702. In some embodiments, a first porous layer 704a can be formed on the surface of the donor substrate 702, which may be etched at a current density ranging from approximately 2 mA/cm$^2$ to 10 mA/cm$^2$. The first porous layer 704a may be etched into the donor substrate 702 to a depth of ranging from approximately 0.5 microns to 2 microns. The etch time for forming the first porous layer 704a may range from approximately 0.5 minutes to 5 minutes. The first porous layer 704a is a low porosity region, which can have a porosity ranging from 20% to 30%. In one example, the first porous layer 704a has a porosity of approximately 25%.

In some embodiments, a second porous layer 704b can be formed buried under the first porous layer 704a. The second porous layer 704b can be etched into the donor substrate 702 underlying the first porous layer 704a by applying a current density ranging from approximately 40 mA/cm$^2$ to approximately 200 mA/cm$^2$ to the donor substrate 702. The second porous layer 704b may be etched into the donor substrate 702 at a depth ranging from about 0.1 to about 1 microns. The etch time for forming the second porous layer 704b may range from approximately 2 seconds to approximately 30 seconds. The second porous layer 704b may have a higher porosity than the first porous layer 704a.

In some embodiments, after etching, the wafers may be rinsed in deionized water, and dried for example under a heated nitrogen flow. In some embodiments, the second porous layer 704b defines a cleave plane after subsequent cleaning, epitaxy, and bonding process steps.

Further details for one exemplary approach to creating a splitting plane, e.g., creating the first and second porous layers 704a, 704b, is described in, for example, Yonehara & Sakaguchi, JSAP Int. July 2001, No. 4, pp. 10-16. The porous layers 704 may also be stabilized via brief thermal oxidation and may also be sealed via anneal under $H_2$ as also described in Yonehara & Sakaguchi, JSAP Int. July 2001, No. 4, pp. 10-16.

In some embodiments, the surface of the porous silicon layers 704a may be heated to form an essentially continuous single crystal silicon layer, via anneal under hydrogen ($H_2$) gas. This step may be conducted in a silicon growth system, or optionally, in a separate annealing system prior to locating the wafers into the silicon growth system. In one example, the Si donor substrate 702 may be subjected to a flow of hydrogen ($H_2$) at a flow rate ranging from 1 sccm to 100 sccm (standard cubic centimeters per minute) at a temperature of about 900° C. to 1150° C. for a time period ranging from 5 minutes to 60 minutes.

Figure 1B:
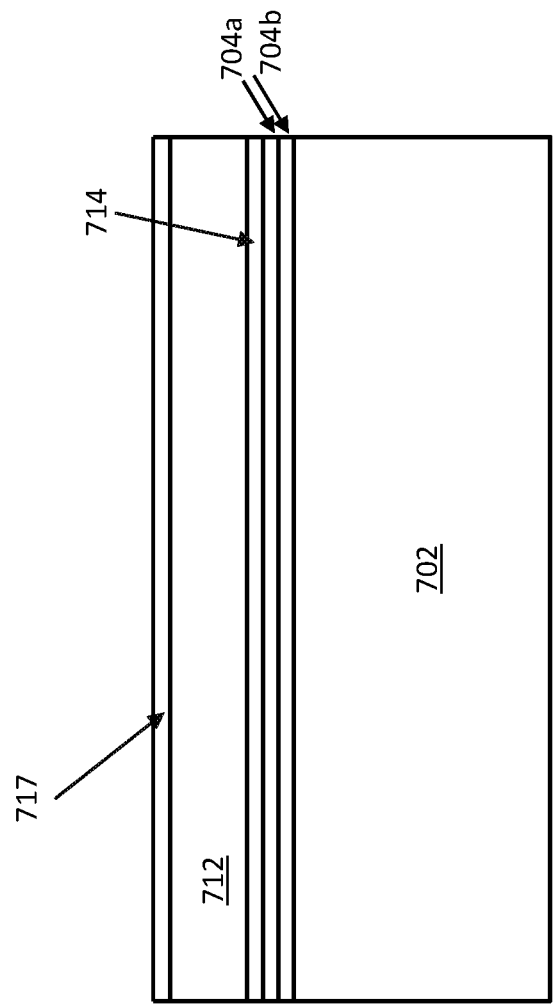

Referring to FIG. 1(b), in some embodiments, the method may continue with forming an epitaxial semiconductor layer 714 on the first porous layer 704a that is formed on the donor substrate 702. In some embodiments, the epitaxial semiconductor layer 714 may be an n-type doped epitaxial silicon (Si) film. The epitaxial semiconductor layer 714 may have a thickness ranging from approximately 100 nm to 1000 nm.

In one example, forming the epitaxial semiconductor layer 714 can begin with loading the donor substrate 702 in a silicon (Si) growth system. In some examples, the epitaxial semiconductor layer 714 may be grown on top of the porous region using Atmospheric Pressure Chemical Vapor Deposition (APCVD) or Low Pressure Chemical Vapor Deposition (LPCVD), for example, with precursors such as dichloro-silane (DCS) or trichloro-silane (TCS), at temperatures above e.g. 700 C. The epitaxial semiconductor layer 714 may be formed using an epitaxial deposition process including in situ doping to provide the conductivity type of the epitaxial semiconductor layer 714. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

Still referring to FIG. 1(b), in one example, the epitaxial semiconductor layer 714 may be an n-type doped epitaxial silicon film with in-situ doping via e.g. phosphorus to a level of greater than about $5 \times 10^{17}$ cm$^{-3}$, for example greater $10^{19}$ cm$^{-3}$. The epitaxy can be performed for example in a batch reactor system to enable lower cost; e.g., an ASM A412 Batch CVD Furnace (see for example "SiGe Epitaxy On A 300 Mm Batch Furnace", Andreas Naumann et al, J Nanosci Nanotechnol. 2011 September; 11(9):8040-3).

A typical precursor used for n-type in-situ doping is phosphine. This n-type region 714 may serve as the base contact region of the solar cell. In some embodiments, high quality epitaxial regions are formed on porous silicon, and may involve a step before epitaxial growth to seal the exposed surface pores, such as, for example, an anneal step under an $H_2$ ambient. In one example, an anneal process for sealing the exposed surface pores is described e.g. in N. Sato at S. Ishii et al, "Reduction of Crystalline defects to 50/cm² in Epitaxial Layers of Porous Silicon for ELTRAN® Process", in the proceedings of the 1998 IEEE Silicon On Insulator conference.

Still referring to FIG. 1(b), in a following step, an n-type doped epitaxial film 712 of thickness e.g. 3-50 microns, with in-situ doping via e.g. arsenic or phosphorous to a level of e.g. $1\times10^{15}$ cm$^{-3}$-$5\times10^{17}$ cm$^{-3}$ may then be grown to provide the base (absorber) region of the solar cell. The n-type doped epitaxial film 712 may also be referred to as base region layer 712. In some embodiments, the base region layer 712 is composed of silicon (Si). However, embodiments have also been contemplated, in which the base region layer 712 is composed of another type IV semiconductor material, or a type III-V semiconductor material.

The semiconductor material layer that ultimately provides the emitter region layer 717 of the solar cell is then formed on the base region layer 712. In some embodiments, the emitter region layer 717 is composed of a semiconductor material that has an opposite conductivity type as the base region layer 712. The interface of the base region layer 712, and the emitter region layer 717 form a p-n junction, and the interaction of these two layers may be referred to as junction layers. For example, when the base region layer 712 is composed of n-type silicon, the emitter region layer 717 may be composed of a p-type semiconductor material, such as p-type silicon. For example, the emitter region layer 717 may be epitaxially formed in situ doped p-type semiconductor material that is growth to a thickness ranging from 100 nm to 5000 nm. To provide the p-type conductivity, the emitter region layer 717 may be in-situ doped, e.g., in situ doped with boron, to a level of greater than about $10^{17}$ cm$^{-3}$. Similar to the base region layer 712, the emitter region layer 717 may be composed of other type IV semiconductor materials besides silicon, and may also be composed of type III-V semiconductor materials.

Figure 1C:
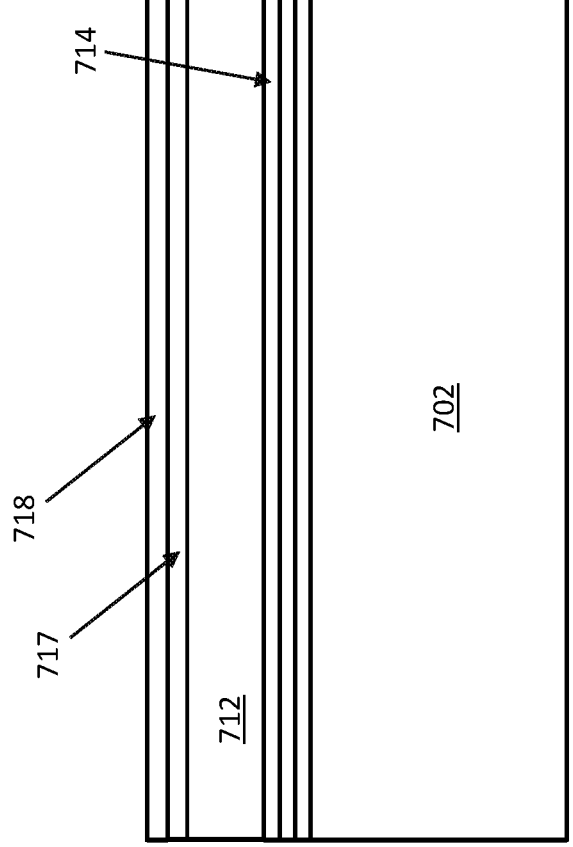

Referring to FIG. 1(c), a rear surface passivation layer may be formed on the structure depicted in FIG. 1(b). In one embodiment, a passivation layer 718 is disposed upon the surface of emitter region layer 717, which can be a p-type silicon layer. The passivation layer 718 may be used to passivate silicon solar cells, and may have a composition such as amorphous silicon ($\alpha$-Si), silicon nitride (SiN$_x$), silicon dioxide (SiO$_2$), silicon oxy-nitride (SiON$_x$), aluminum oxide (Al$_2$O$_3$), or a combination of these layers, such as Al$_2$O$_3$ followed by either SiN$_x$, SiON$_x$, or SiO$_2$.

In some embodiments, the passivation layer 718 may be deposited via common methods, well known in the art, such as plasma-enhanced chemical vapor deposition (PECVD), atomic layer deposition (ALD), or in the case of SiO$_2$, wet chemical oxidation or thermal oxidation of the emitter region layer 717 when composed of silicon containing material, such as p-type silicon. The thickness of the passivation layer 718 or layers can be in the range of e.g. 10 nm to 500 nm. In one example, the passivation layer 718 can be provided by a first dielectric material, such as aluminum oxide layer of thickness in the range of 5 nm to 50 nm, which can be capped by a second dielectric material layer of SiN$_x$, SiON$_x$, or SiO$_2$ having a thickness in the range of 50 nm to 300 nm.

Figure 1D:
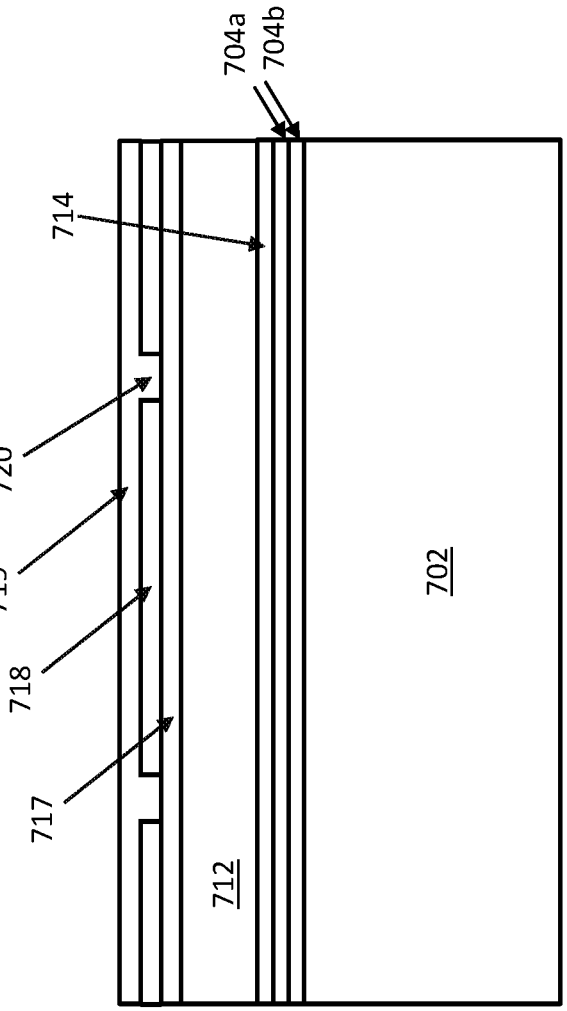

Referring to FIG. 1(d), a contact layer 719 may be disposed on passivation layer 718. In some embodiments, the contact layer may comprise a metal composition, such as aluminum (Al), and may be deposited via standard methods such as evaporation, sputtering, screen printing (of aluminum-containing paste), plating or a combination thereof.

In cases where passivation layer 718 is electrically insulating, contact layer 719 will need to penetrate a portion of passivation layer 718 to achieve electrical contact to the solar cell, via openings 720. Referring to FIG. 1(d), the portion of the contact layer 719 that extends through the openings 720 through the passivation layer 718 are in direct contact with the emitter region layer 717. The openings 720 can be formed by methods, including photolithography, laser annealing, laser ablation and combinations thereof. The process sequence for forming the openings 720 through the passivation layer 718 are typically performed before forming the contact layer 719. One example of forming openings 720 through a passivation layer 718 including photolithography, and/or through laser ablation is described in Jens Müller et al, Journal Of Applied Physics 108, 124513 (2010)).

In another embodiment, the contact layer 719 may be formed including portions that are fired through the passivation layer 718 into contact with the emitter region layer 717. One example of a method for firing the contact layer 719 through the passivation layer 718 is described in, for example, E. Schneiderlöchner, R. Preu, R. Lüdemann, and S. W. Glunz, "Laser-Fired Rear Contacts for Crystalline Silicon Solar Cells," Progress in Photovoltaics: Research and Applications 20 (2002) 29.

Note that the combination of a dielectric layer (passivation layer 718) backed by a metal layer (contact layer 719), such as aluminum, can form a very effective reflector layer for the rear of the completed solar cell. Further details for one example of employing the combination of the dielectric layer (passivation layer 718) backed by a metal layer (contact layer 719) can be found in "Hybrid Dielectric-Metallic Back Reflector for Amorphous Silicon Solar Cells" by Mutitu et al. in *Energies* 2010, 3, 1914-1933.

In the methods for forming openings 720 that includes photolithograpy, laser ablation and/or laser annealing, after contact layer 719 deposition, an anneal may be performed to cause Al doping of the Si through the openings 720 (such as described in "Characterization Of Local Al-BSF Formation For Perc Solar Cell Structures" by Grasso et al, Proceedings of the 25th European PV Solar Energy Conference, Valencia, Spain, 2010) thus forming p+ regions in the silicon (not illustrated) aligned with the contact openings 720. In some embodiments, these p+ regions may be doped up to about $10^{19}$ cm$^{-2}$ or higher, and may extend into silicon up to e.g. 1-10 microns. This can lead to reduced contact resistance in the solar cell.

Figure 1E:
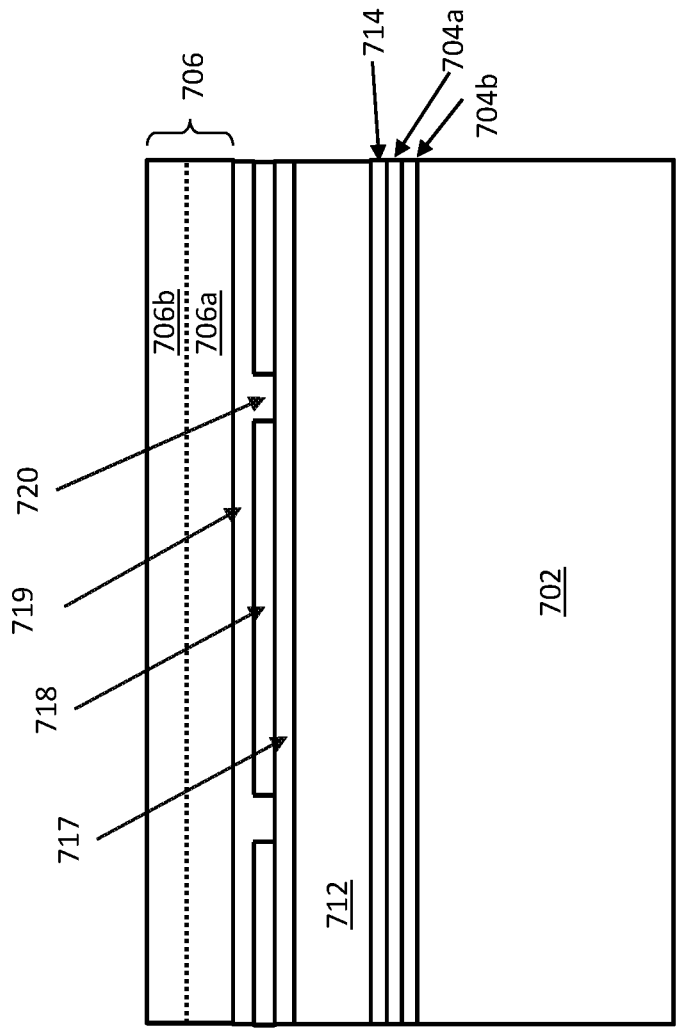

Referring to FIG. 1(e), the process flow can be continued by forming conductive metal bonding layers 706a, 706b on the surface of the contact layer 719 that is connected to the donor substrate 702. In one embodiment, bonding layers 706a, 706b may be comprised of a high melting point metal layer 706a followed by a low-melting-point metal layer 706b. Each of the high melting point layer 706a, and the low melting point layer 706b, may have a thickness ranging from about 0.5 microns to about 5.0 microns.

In one example, the high melting point layer 706a could be composed of nickel (Ni) or titanium (Ti), and the low melting point layer 706b may be tin (Sn). In another example, the high melting point layer 706a could be copper (Cu), and the low melting point layer 706b may be indium (In). The high melting point layer 706a may be of thickness sufficient so that all of low melting point layer 706b is consumed in the formation of an intermetallic compound layer 711 as is described subsequently. In one example, the high melting point layer 706a may be 50% thicker than the low melting point layer 706b. Additionally, in some examples, the deposition of the high melting point layer 706a may be preceded by deposition of a thin layer to promote adhesion. In some examples, the thin layer for promoting adhesion can be composed of a metal, such as chromium (Cr) or titanium (Ti), and can have a thickness ranging from 10 nm to 50 nm.

The high melting point layer 706a and the low melting point layer 706b that provide the bonding layers, as well as the thin layer for promoting adhesion, may be deposited by processes that can include, but are not limited to, thermal evaporation, sputtering, electrodeposition, electroless plating, or screen printing. The deposition process may be performed such that there is no exposure to an oxygen-containing ambient between the depositions of different metal layers, to prevent native oxide formation between the different metal layers.

Figure 1F:
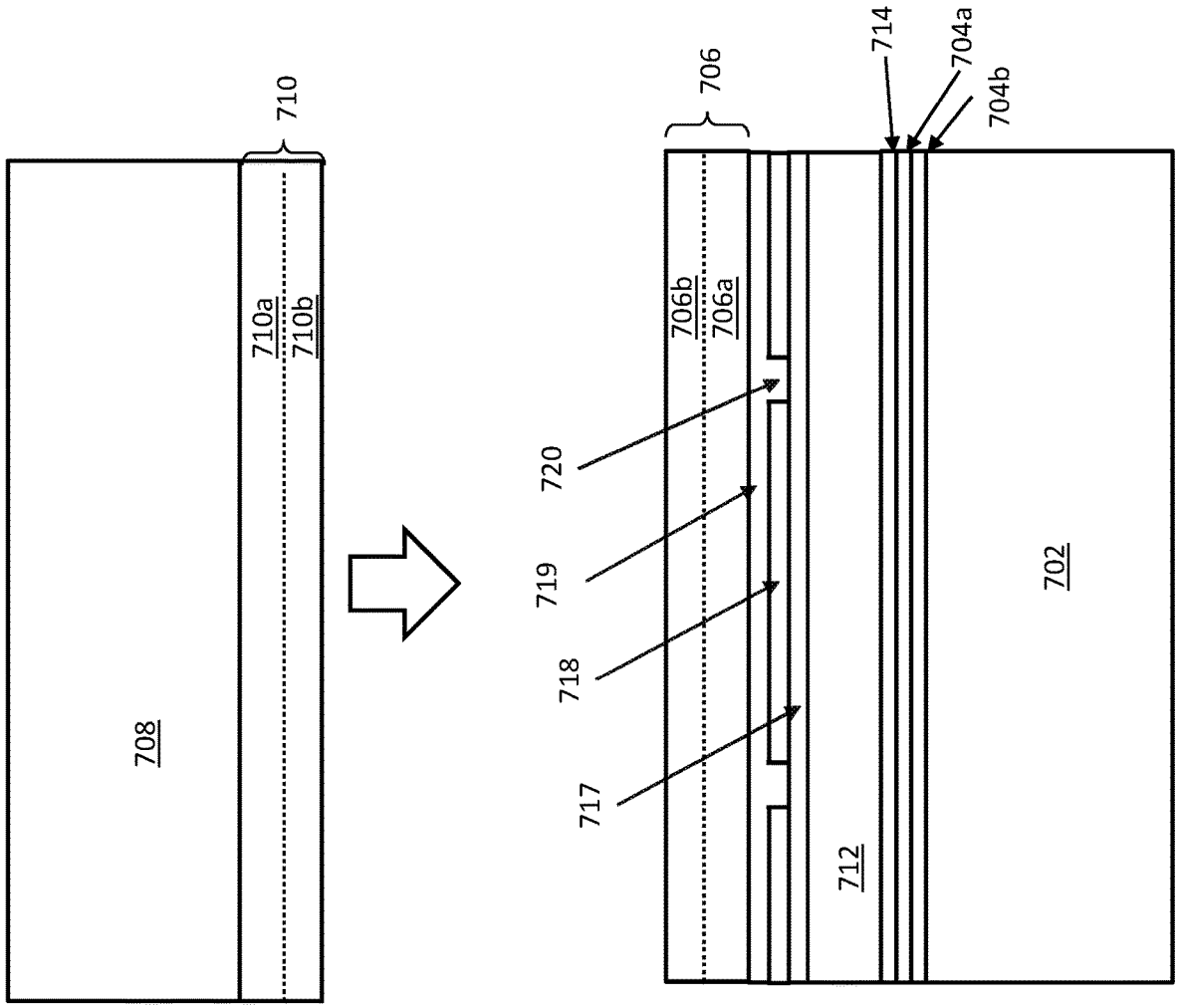

Referring to FIG. 1(f), in some embodiments, a carrier substrate 708 may be prepared for bonding to the donor substrate 702, including the first portion of a solar cell. The bonding between the donor substrate 702 and the carrier substrate 708 can be provided through the high melting point layer 706a and the low melting point layer 706b that provide the bonding layers between the donor substrate 702 and the carrier substrate 708.

In some embodiments, the carrier substrate 708 may be composed of an inexpensive metallurgical grade silicon (Si), or the carrier substrate 708 may be composed of a metal, such as steel, or a low coefficient of thermal expansion (low-CTE) iron-nickel alloy. Examples of low-CTE metals of iron nickel alloy can include Kovar™ or Invar™. In another embodiment, the carrier substrate 708 can be composed of a conductive ceramic, such as polycrystalline aluminum titanium nitride. In yet another embodiment, the carrier substrate 708 can be composed of a glass substrate, such as a float glass or borosilicate glass substrate. The thickness of the carrier substrate 708 when composed of float glass or borosilicate glass can range from 0.1 mm to 2.0 mm.

In some embodiments, the carrier substrate 708 may be of the same, or a similar size, as the donor substrate 702, or it may be larger, such as to support multiple solar cells. In one embodiment, the carrier substrate 708 may be rigid with a thickness in the range of 100 microns to 500 microns. In other embodiments, the carrier substrate 708 may be flexible. For example, the carrier substrate 708 can be composed of a steel foil having a thickness less than 150 microns. The carrier substrate 708 may be electrically conductive. Alternately, the carrier substrate 708 can be insulating, but may be coated with metal layers on some or all of its surfaces to allow it to function as a conductive back contact to the thin Si solar cell. For example, the carrier substrate 708 can be float glass coated (encapsulated) partially or completely in a metal layer, such as nickel (Ni) or aluminum (Al), having a thickness ranging from 1 micron to 10 microns. In some embodiments, the coating to provide that the float glass is encapsulated in metal can be applied by evaporation, sputtering, or electrodeposition, for example.

In some embodiments, the Coefficient of Thermal Expansion (CTE) of the carrier substrate 708 may be approximately matched to that of silicon (Si), to allow for subsequent thermal processing steps to form the solar cell without giving rise to excessive stress in the thin monocrystalline solar cell regions due to a mismatch between the CTE of silicon and that of the carrier substrate 708. For example, the CTE of the carrier substrate 708 may be less than about 6-10 ppm/° K at room temperature, e.g., 20° C. to 25° C. The carrier substrate 708 may have a peak-to-valley surface roughness of e.g. less than 3 microns, and a low local micro-roughness (e.g. less than 2 microns root-mean-square roughness).

Referring to FIG. 1(f), metal bonding layers 710 may be deposited on the surface of the carrier substrate 708. In one embodiment, the metal bonding layers 710 may be comprised of a high melting point metal layer 710a followed by a low-melting-point metal layer 710b. Each of the high melting point layer 710a, and the low melting point layer 710b, may have a thickness ranging from about 0.5 microns to about 5.0 microns. In one example, the high melting point layer 710a may be composed of nickel (Ni) or titanium (Ti), and the low melting point layer 710b may be composed of tin (Sn). In another example, the high melting point layer 710a may be composed of copper (Cu), and the low melting point layer 710b may be composed of indium (In). High melting point layer 710a may be of thickness sufficient so that all of low melting point layer 710b is consumed in the formation of intermetallic compound layer 711 as described subsequently. For example, the high melting point layer 710a may be 50% thicker than the low melting point layer 710b. In some embodiments, deposition of high melting point layer 710a may be preceded by deposition of a thin layer to promote adhesion, such as chromium (Cr) or titanium (Ti). The adhesion promoting layer may have a thickness ranging from 10 nm to 50 nm.

The high melting point layer 710a and the low melting point layer 710b that provides the bonding layer 710, as well as the adhesion promoting layer, may each be deposited by thermal evaporation, sputtering, electrodeposition, electroless plating, screen printing or a combination thereof. The deposition may be performed such that there is no exposure to an oxygen-containing ambient between the depositions of different metal layers, to prevent native oxide formation between the different metal layers. In one embodiment, the low temperature metal bonding layer identified by reference number 710b that is described with reference to FIG. 1(f) may be of the same material as the low temperature bonding layer identified by reference number 706b that is described with reference to FIG. 1(e). In one embodiment, the high temperature metal bonding layer identified by reference number 710a that is described with reference to FIG. 1(f) may be of the same material as the high temperature bonding layer identified by reference number 706a that is described with reference to FIG. 1(e). For example, each of the bonding layers identified by reference numbers 710b and 706b may both be comprised of tin (Sn); and each of the metal bonding layers 710a and 706a may both be comprised of nickel (Ni) or titanium (Ti).

Referring to FIG. 1(f), prior to bonding any native metal oxides that may have formed on the exposed surface of the metal bonding layers may be removed via a plasma cleaning step. In one example, the plasma cleaning step may employ an AQ-2000 plasma cleaner made by Samco. Removal of the oxides is not required, but can improve the quality of the bond that engages the donor substrate 702 to the carrier substrate 708.

In some embodiments, the wafer bonding, i.e., bonding between the donor substrate 702 and the carrier substrate 708, can be achieved in a tool, such as an EVG (Electronic Visions Group) 510 bonder, or a SUSS SB6e bonder, or a heated mechanical press, or in a solar module laminator, possibly modified for higher laminating temperature. In one embodiment, the donor substrate 702 and carrier substrate 708 are approximately the same size, and are brought substantially into alignment prior to contact, e.g. with not more than 1 mm lateral offset, within the bonding tool. In one example, the wafers, e.g., the donor substrate 702 and the carrier substrate 708, may be brought into contact in a closed bonding chamber, in an ambient of nitrogen or air at a background pressure ranging from 0.01 atm to 1 atm. For example, after wafers are brought into contact, a force ranging from approximately 0.1 MPa to 1 MPa may be applied. While this force is maintained, the contacted wafer pair, e.g., structure including the donor substrate 702 and the structure including the carrier substrate 708, may be brought to a peak temperature above the melting point of the low-melting-point metal for the low melting point bonding layers 706b, 710b.

In one example, the low temperature for bonding may range from 232° C. to 300° C. if the low-melting-point metal for the low melting point bonding layers 706b, 710b is tin (Sn). This temperature may be maintained only briefly, e.g., for a time period ranging from 1 second to 60 seconds. In another example, the temperature may be maintained for a time ranging from 1 minute to 60 minutes. While the low-melting-point layers, e.g., the low melting point bonding layers 706b, 710b, are in a liquid phase, they may conform to any non-planar topology at the bonded interface arising from (a) surface roughness of the donor or carrier wafer, (b) particles at the bonding interface, or (c) deliberate surface texturization of a rear solar cell surface, provided that such topology is thinner than the combined thickness of the low-melting-point metal layers on one or both of the donor and carrier wafer. Once the low melting point layers melt, e.g., the low melting point bonding layers 706b, 710b melt, diffusion between the low- and high-melting point metal layers, e.g., diffusion between the low melting point bonding layers 706b, 710b and the high melting point bonding layers 706a, 710a, will typically be enhanced.

Figure 1G:
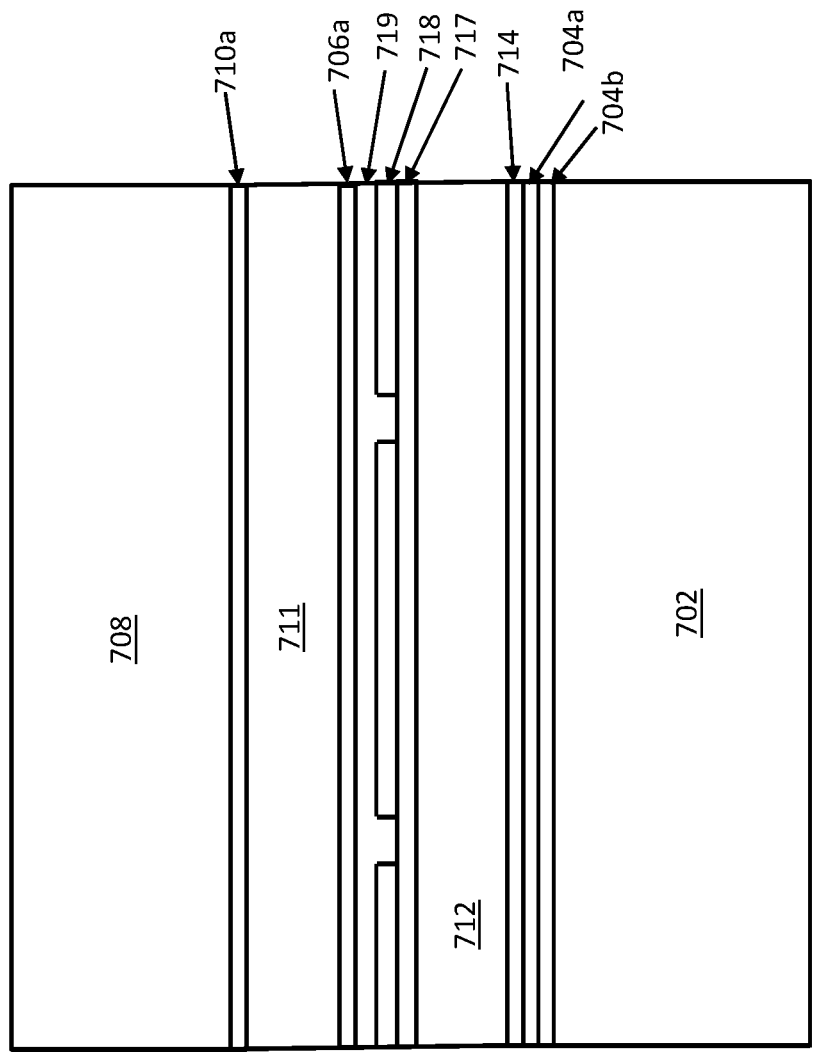

Referring to FIG. 1(g), the diffusion between the low melting point bonding layers 706b, 710b and the high melting point bonding layers 706a, 710a, may lead to the formation of a intermetallic compound layer 711. In some embodiments, the intermetallic compound layer 711 can be comprised of $Ni_ySn_z$ (e.g. $Ni_3Sn_4$), or $Ti_wSn_x$ (e.g. $Ti_6Sn_5$), or $Cu_2In_v$ (e.g. $Cu_2In$). The intermetallic compound layer 711 may have a melting point substantially higher than the melting point of the low-melting-point metal layers 706b, 710b, and so the intermetallic compound layer 711 may solidify isothermally even while the metal layer stack remains exposed to the peak bonding temperature. This approach to metallic bonding, where a resulting intermetallic metal compound bonding layer 711 has a melting point higher than some of the constituent layers, has been referred to as Transient Liquid Phase bonding. Further details regarding some examples of Transient Liquid Phase bonding are described in "Transient Liquid Phase Bonding" by W. D. MacDonald and T. W. Eagar, Anna. Rev. Mater. Sci. 1992.22:23-46. This process may consume substantially all of the low melting point layers 706b and 710b, so the bonded metal joint will remain solid for temperatures well above the melting point of the low melting point metal. Some of high melting point layers 710a and/or 706a may remain unconsumed in the formation of intermetallic compound layer 711.

Referring to FIG. 1(h), the donor substrate 702 may be removed from the first portion of a solar cell bonded to the carrier substrate 708 by cleaving the donor substrate 702 within the porous layers 704a, 704b. Separation may be via mechanical force alone, or enhanced with various other methods. For example, for the case of a flexible carrier substrate, mechanical flexing of the substrate may force a split to occur within the porous silicon regions 704a, 704b, leading to separation of donor substrate 702 from the first portion of a solar cell bonded to the carrier substrate 708. In another example, a wedged device (not shown) may be applied to induce separation at the exposed external edges of the porous regions 704a, 704b. In another example, separation at the porous layers 704a, 704b may be enhanced via application of a high pressure water jet directed at the edge of the porous layers 704a, 704b. Further details for one example of separation at the porous layers 704a, 704b that employs a high pressure water jet is described in Yonehara & Sakaguchi. In yet another example, a wet acid solution, such as $HF/H_2O_2$, may also be exposed to the porous layers 704 to them from the edge and enhance separation. In yet another example, for the case of a carrier substrate 708 with a CTE different than that of the silicon donor substrate 702, a thermal anneal may be used to induce stress in the bonded wafer pair, leading to separation within the porous Si layers 704 to relieve the stress. It should be understood that the above examples of separation may be used individually or in various combinations. Also, it should be noted that, for the case of a carrier substrate 708 with a CTE substantially different than that of the silicon donor substrate 702, it may be that cool down from bonding temperatures will induce sufficient stress in the bonded wafer pair to cause automatic separation within the porous Si layers 704.

Topside processing of the solar cell is now described with reference to FIGS. 1(i)-1(k), 1(m), 1(n) and 1(p). Referring to FIG. 1(i), once the carrier substrate 708 and the attached solar cell layers, which includes the emitter region layer 717, the epitaxial semiconductor layer 714 (also referred to as base contact layer 714) and the base region layer 712, have been separated from the donor substrate 702, a residual of porous silicon layers 704b may remain on top of epitaxial semiconductor layer 714. FIGS. 1(i)-1(k), 1(m), 1(n) and 1(p) are flipped vertically from previous diagrams. The residual porous silicon layers 704b may be removed with a wet acid etch as described in Yonehara & Sakaguchi, or in Nobuhiko Sato et al, Journal of the Electrochemical Society, v. 142 n. 9 p. 3116-22; or via an etch in a KOH (Potassium hydroxide) solution; or via an ammonium fluoride ($NH_4F$) solution; or via polishing. In another example, residual porous Si layer 704b may be removed in a mixture of DI water, $NH_4F$ and $H_2O_2$ in a ratio of e.g. 5:1:1, at a temperature of ranging from 40° C. to 90° C., for a time period ranging from 1 minute to 20 minutes. The etch process for removing the residual porous silicon layers 704b may be selective to the underlying epitaxial semiconductor layer 714. As used herein, the term "selective" in reference to a material removal process denotes that the rate of material removal for a first material is greater than the rate of removal for at least another material of the structure to which the material removal process is being applied. For example, the etch process for removing the residual porous layers 704b may etch all of the porous silicon (Si) of the residual porous layers 704b substantially faster than single-crystalline non-porous silicon of the epitaxial semiconductor layer 14. The transition of the surface appearance from non-specular to specular may provide indication that the porous silicon (Si) removal is substantially complete. In other embodiments, it may be advantageous to leave some or all of residual porous layers 704b intact, as the porous surface's roughness may enhance adhesion of the subsequently deposited grid metal.

In some embodiments, after splitting (also referred to as cleaving) the donor substrate 702 may be processed for reuse in the next wafer production cycle. This processing may include polishing, wet etching, or otherwise cleaning of the cleaved surface for subsequent formation of porous layers in future wafer production cycles. For example, this processing may include the removal of the portion of porous Si layers 704a, 704b which remained attached to the donor substrate 702, via immersion in a potassium hydroxide (KOH) solution of concentration 45% for a time period ranging from 30 minutes to 90 minutes at room temperature, e.g., 20° C. to 25° C.

Referring to FIG. 1(*j*), a sacrificial patterned masking layer 750 with openings 751 can be formed for the subsequent electroplating of the solar cell top contact grid. This patterned masking layer can be formed by various methods. For example, photolithography can be used to pattern the sacrificial masking layer 750. In other examples, openings 751 in the sacrificial masking layer 750 may be formed using laser ablation and lift off processes. One example of a process that employs at least one of laser ablation and lift off processes to form openings 751 in the sacrificial masking layer 750 is described in "Laser ablation of etch resists for structuring and lift-off processes" by A. Knorz et al., Proc. 24th EU Photovolt. Spec.Conf, 2009, 2164-2167. In this approach, polymer masking layer 750 is deposited on a Si surface via screen printing. Openings 751 in the masking layer are then created via laser ablation using either UV or IR lasers as described in Knorz. As another alternative, the patterned masking layer 750 can be directly screen printed, with the openings 751 formed as part of the screen printing process.

In one example, the masking layer 750 can have a thickness ranging from approximately 0.5 microns to 20 microns, and the width of the openings 751 formed through the making layer 750 may range from 5 microns to 50 microns. In another example, the masking layer 750 can have a thickness ranging from approximately 1 micron to 5 microns, and the width of the openings 751 formed through the making layer 750 may range from 20 microns to 30 microns.

FIG. 1(*k*) depicts forming metal contactor lines 716 include portions within openings 751. The metal contactor lines 716 may be formed using physical vapor deposition (PVD) methods, such as sputtering; plating methods, such as electroplating and/or electroless plating; and chemical vapor deposition, such as metal organic chemical vapor deposition. In some embodiments, the metal contact lines 716 can be formed via Ni/Cu plating, as described for example in "Evolution of metal plating for silicon solar cell metallization" by A. Lennon et al., in Prog. Photovolt: Res. Appl. v21 n7 p 1454-68 (2012). Plating may also be used to deposit an additional thin layer of Ag or Sn on top of the Cu, to protect the Cu lines from being oxidized, and promote easier soldering of tabs used for cell interconnection. This Ag or Sn can also protect the grid lines from the subsequent texturization etch. Plated line width is controlled by the width of openings 751, as masking layer 750 itself is not plated.

Referring to FIG. 1(*m*), after plating masking layer 750 may be removed in a solvent solution. Alternately it may be removed as part of the subsequent surface texturization step.

After application of metal contact materials 716, the structure may be annealed at a temperature ranging from 100° C. to 400° C. This anneal may be performed in an ambient of e.g. forming gas.

Subsequently, referring to FIG. 1(*n*), a texturized surface 715 can be formed to improve light trapping, for example in a potassium hydroxide (KOH) based solution, or a sodium hydroxide (NaOH) based solution. The textured surface 715 may also be formed using a tetramethylammonium hydroxide (TMAH) wet etch. This texturization step may remove the base contact layer 714 in all exposed areas. Note that n-type region 714 is protected in the areas beneath the top grid 716. In some embodiments, the n-type region 714, which provides the base contact layer 714 is only present between the metal contact materials 716 and the base region layer 712. The texturing step can remove the porous Si layer in all exposed areas, in embodiments where it was not removed in previous steps. The texturized surface 715 could be formed via a shallow texturization process to minimize the amount of silicon removal. An example shallow texturization process is described in Section 4.1.2.2 of "Development of a high performance ultra-thin silicon solar cell on steel substrate", a Ph.D. thesis by Lu Wang (2014), UNSW Australia. In one example, the peak to valley depth of the textured surface may range from 100 nm to 5 microns. While the texturized surface is illustrated as fully regular, the texturized surface may also be partially or fully random. For example, for a surface with pyramidal texturing, the size of the pyramids may vary significantly.

Referring to FIG. 1(*p*), passivation layer 730 can be deposited over the entire solar cell top surface. The passivation layer 730 can be a silicon nitride or silicon oxy-nitride layer, deposited for example by plasma enhanced chemical vapor deposition (PECVD). In other examples, the passivation layer 730 may be amorphous silicon (a-Si) or aluminum oxide ($Al_2O_3$). In addition to plasma-enhanced chemical vapor deposition (PECVD), the passivation layer 118 may also be deposited via methods such as atomic layer deposition (ALD), or thermal oxidation. The passivation layer 730 depicted in FIG. 1(*p*) can also serve as an anti-reflection coating.

Figure 2:
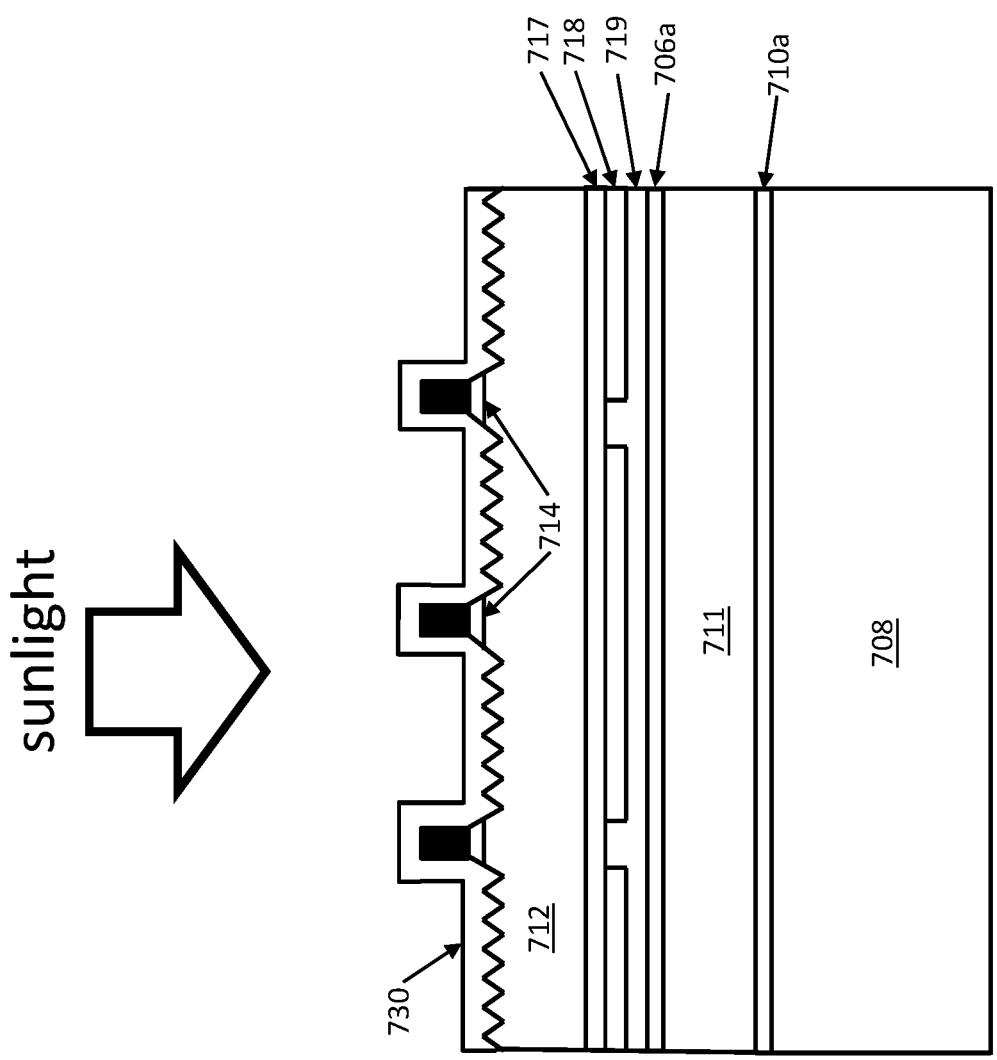
FIG. 2 is a profile diagram of a completed device in accordance with the exemplary solder bonding embodiment of the invention.

Referring to FIG. 2, the cell on the carrier substrate 708 may have the exemplary basic cell structure. N-type epitaxially grown silicon 712 may provide the solar cell base region. N+ epitaxially grown region 714 may provide the solar cell base contact region. Contact layer 719 (or in the absence of such contact layer, high melting point layer 706a) may provide bottom electrical contact to the p-type emitter region 717. Contact layer 719 (or in the absence of such contact layer, high melting point layer 706a) may provide light reflection for more complete light absorption in the base region.

This thin silicon cell approach may allow the high electrical conversion efficiency typical of bulk monocrystalline silicon solar cells (where whole silicon wafers of e.g. 150 micron thickness or more are used to form the solar cell) but with significant cost savings because of the dramatically reduced usage of the relatively expensive high-quality monocrystalline silicon. This advantage may be realized through the re-use multiple times of the relatively expensive monocrystalline silicon donor wafer 702. Another advantage of this structure may be a high open circuit voltage, due to the low recombination volume of the thin base region, leading to higher cell efficiency.

In an alternative embodiment, the configuration of the base and emitter can be reversed, so that in the deployed cell the n+ base contact region is buried and facing away from the sun, and the p+ emitter is facing the sun. In another alternative embodiment, the doping types can be reversed, so that the base region is p-type, the emitter region is n+, and the base contact region is p+. For this case, the cell may be configured such that the emitter is on the upper surface of the solar cell (facing the sunlight) and the base contact region is below the base and in proximity to the conductive bonding layers. Alternatively, the cell may be configured such that the base contact region is on the upper surface of the solar cell (facing the sun) and the emitter region is below the base and in proximity to the conductive bonding layers.

In order to make interconnections between individual solar cells to form solar modules, there must be topside connections made to the top metal contact lines 716. This is typically done via soldering electrical leads to the solar cell busbars, which are regions of the top metal contact pattern that are typically 1 mm or more in width. The solar cell described above has passivation and ARC layer 730 deposited on top of the top metal contact 716. Passivation layers are typically insulating, so in order to make electrical contact through this layer it may be necessary to use a soldering flux to cut through the passivation/ARC layer. Alternately, a light mechanical abrasion over the busbar may be used to remove a portion of layer 730.

Referring to FIG. 3, construction of the exemplary solder bond device 900 may include the following actions. The donor substrate 702 as previously described is provided (block 902). One or more porous layers 704a, 704b are formed on the donor substrate (block 904). A solar cell or device is constructed or partially constructed on top of the porous layer of the donor substrate by, for example, epitaxial growth (block 906) or other steps previously described. The solar cell may include a base region layer 712 and emitter region layer 717. A solder bonding layer is deposited on the donor substrate (block 912). The solder bonding layers 706a, 706b have been described above with reference to FIG. 1(*e*). Referring back to FIG. 3, the carrier substrate 708 is prepared by, for example, also depositing a solder bonding layer (block 914). The solar cell or device and donor substrate are solder bonded to the carrier substrate (block 916). Solder bonding at this stage of the process flow includes bonding layers 710a, 710b, as described above with reference to FIGS. 1(*f*) and 1(*g*). The solar cell or device and carrier substrate are removed from the donor substrate by cleaving processes as previously described (block 918). The solar cell or device is processed further to completion (block 920) and the separated donor substrates may be processed for recycling. Topside processing in accordance with block 920 has been described in greater detail with reference to FIGS. 1(*i*)-1(*k*), 1(*m*), 1(*n*) and 1(*p*). The exemplary method of construction may be modified to incorporate other embodiments, for example, but not limited to actions associated with rear surface passivation and contacting as described in previous embodiment.

It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity. The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of this invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications. These procedures will enable others, skilled in the art, to best utilize the invention and various embodiments with various modifications. It is intended that the scope of the invention be defined by the following claims and their equivalents. Modifications and substitutions by one of ordinary skill in the art are considered to be within the scope of the present invention, which is not to be limited except by the following claims.

What is claimed is:

1. A method of forming a solar cell device, comprising:
   forming a porous layer in a monocrystalline donor substrate;
   forming an epitaxial semiconductor layer on the porous layer;
   forming a base region layer on the epitaxial semiconductor layer;
   forming an emitter region layer on the base region layer to provide a junction for a solar cell structure;
   bonding a carrier substrate to the solar cell structure through a bonding layer;
   removing the monocrystalline donor substrate by cleaving the porous layer;
   forming a grid of metal contacts on the epitaxial semiconductor layer;
   removing exposed portions of the epitaxial semiconductor layer, wherein remaining portions of the epitaxial semiconductor layer remain between the grid of metal contacts and the junction for the solar cell structure;
   texturing an exposed surface of the base region layer of the solar cell structure to provide a textured surface of the base region layer, wherein said texturing the exposed surface of the base region layer is after forming said junction of the solar cell structure, the junction of the solar cell structure for receiving light; and
   forming a passivation layer on at least the textured surface of the base region layer, wherein the passivation layer is in direct contact with the textured surface of the base region layer, wherein the epitaxial semiconductor layer is a base contact region having a higher dopant concentration than the base region.

2. The method of claim 1, wherein the passivation layer provides an anti-reflective coating.

3. The method of claim 1, wherein the bonding layer produces a transient liquid phase bond.

4. The method of claim 3, wherein the bonding layer produces a transient liquid phase bond with an intermetallic region comprising nickel (Ni) and tin (Sn).

5. The method of claim 3, wherein the bonding layer produces a transient liquid phase bond with an intermetallic region comprising titanium (Ti) and tin (Sn).

6. The method of claim 3, wherein the bonding layer produces a transient liquid phase bond with an intermetallic region comprising copper (Cu) and indium (In).

7. The method of claim 1, wherein the forming of the porous layer further comprises producing a first low porosity layer to serve as a template for constructing the epitaxial semiconductor layer, and a high porosity layer at which cleaving the porous layer occurs.

8. The method of claim 1, wherein the carrier substrate has a composition selected from the group consisting of a semiconductor material, a metal material, a glass material, or a combination thereof.

9. The method of claim 8, wherein the carrier substrate comprises steel or an iron nickel alloy.

10. A method of forming a solar cell device, comprising:
    forming a porous layer in a monocrystalline donor substrate;

forming an epitaxial semiconductor layer on the porous layer;

forming a base region layer on the epitaxial semiconductor layer;

forming an emitter layer on the base region layer to provide a junction for a solar cell structure on the epitaxial semiconductor layer, wherein the junction of the solar cell structure;

bonding a carrier substrate to the solar cell structure through a bonding layer;

removing the monocrystalline donor substrate by cleaving the porous layer;

forming a grid of metal contacts on the epitaxial semiconductor layer after forming the junction for the solar cell;

removing exposed portions of the epitaxial semiconductor layer, wherein remaining portions of the epitaxial semiconductor layer remain between the grid of metal contacts and the junction for the solar cell structure;

texturing an exposed surface of the base region layer of the solar cell structure to provide a textured surface of the base region; and forming a passivation layer on at least the textured surface of the base region layer, the passivation layer is in direct contact with the textured surface of the base region layer, wherein the passivation layer provides an anti-reflective coating, and wherein the epitaxial semiconductor layer is a base contact region having a higher dopant concentration than the base region.

11. The method of claim 10, wherein the bonding layer produces a transient liquid phase bond.

12. The method of claim 11, wherein the bonding layer produces a transient liquid phase bond with an intermetallic region having a composition selected from the group consisting of $Ni_3Sn_4$, $Ti_6Sn_5$, $Cu_2In$ and combinations thereof.

13. The method of claim 12, wherein the passivation layer has a composition selected from the group consisting of silicon nitride, silicon oxide, amorphous silicon (a-Si), aluminum oxide and combinations thereof.

* * * * *